United States Patent [19]
Kobayashi

[11] Patent Number: 5,500,816
[45] Date of Patent: Mar. 19, 1996

[54] NON-VOLATILE SEMICONDUCTOR MEMORY DEVICE AND MANUFACTURING METHOD THEREOF

[75] Inventor: Kiyoteru Kobayashi, Hyogo, Japan

[73] Assignee: Mitsubishi Denki Kabushiki Kaisha, Tokyo, Japan

[21] Appl. No.: 203,074

[22] Filed: Feb. 28, 1994

[30] Foreign Application Priority Data

Jul. 30, 1993 [JP] Japan .................................. 5-190259

[51] Int. Cl.$^6$ .................................................. G11C 16/04
[52] U.S. Cl. .......................... 365/185; 257/316; 257/321; 257/324; 257/637; 257/638; 257/640; 257/649
[58] Field of Search .............................. 365/185; 257/316, 257/321, 329, 325, 637, 638, 640, 649

[56] References Cited

U.S. PATENT DOCUMENTS

| | | | |
|---|---|---|---|
| 4,868,619 | 9/1989 | Mukherjee et al. | |
| 5,101,249 | 3/1992 | Hijiya et al. | 365/185 |
| 5,258,645 | 11/1993 | Sato | 257/637 |
| 5,286,994 | 2/1994 | Ozawa et al. | 257/324 |
| 5,304,829 | 4/1994 | Mori et al. | 257/324 |

FOREIGN PATENT DOCUMENTS 62-146332 6/1987 Japan.
63-310179 12/1988 Japan.

OTHER PUBLICATIONS

"An In–System Reprogrammable 32Kx8 CMOS Flash Memory" by Virgil Niles Knyett et al., IEEE Journal of Solid–State Circuits, vol. 23, No. 5, Oct. 1988.
Extended Abstracts of the 22nd Conference on Solid State Devices and Materials, Sendai, 1990, pp. 171–174, N. Ajika et al., "Optimum Of Nitrid And RE–DX."Appl. Phys. Lett. 60(12), 23 Mar. 1992, pp. 1489–1491, A. Joshi et al, International Electron Device Meeting, 1991, pp. 649–652, S. Kunsunoki et al.

*Primary Examiner*—Joseph E. Clawson, Jr.
*Attorney, Agent, or Firm*—Lowe, Price, LeBlanc & Becker

[57] ABSTRACT

A tunnel insulating film is formed on a main surface of a silicon substrate. A floating gate electrode is formed on the tunnel insulating film. A nitride layer formed of a material of the floating gate electrode is formed in the vicinity of an interface between the floating gate electrode and the tunnel insulating film located in a tunnel region A. Therefore, the write/erase characteristics of a non-volatile semiconductor memory device can be improved without decreasing the driving capability of a memory transistor at lower voltages.

7 Claims, 19 Drawing Sheets

N₂ CONCENTRATION IN TOP SURFACE OF TUNNEL INSULATING FILM(atms/cm³)

POSITIONS ON SUBSTRATE

NON-VOLATILE SEMICONDUCTOR MEMORY DEVICE AND MANUFACTURING METHOD THEREOF

BACKGROUND OF THE INVENTION

1. Field of the Invention

The present invention relates to an electrically erasable and programmable non-volatile semiconductor memory device and a manufacturing method thereof. More specifically, the present invention relates to a non-volatile semiconductor memory device having a structure enabling improved write/erase characteristics without decreasing its driving capability and a manufacturing method thereof.

2. Description of the Background Art

A memory device in which a data can be written freely and is electrically erasable has been known as a flash memory. An EEPROM (Electrically Erasable and Programmable) which can collectively erase electrically electric charges of written data, so-called flash memory, has been proposed in U.S. Pat. No. 4,868,619 or in "An In-System Reprogrammable 32K×8 CMOS Flash Memory" by Virgil Niles Kynett et al., IEEE *Journal of Solid-State Circuits*, vol. 23, No. 5, October 1988.

By way of example, the above-mentioned flash memory will be described referring to FIGS. 10–24. FIG. 10 is a block diagram showing a general structure of the flash memory.

Referring to FIG. 10, a flash memory includes a memory cell array 100, an X address decoder 200, a Y gate 300, a Y address decoder 400, an address buffer 500, a write circuit 600, a sense amplifier 700, an input/output buffer 800, and a control logic 900.

Memory cell array 100 includes a plurality of memory transistors arranged in a matrix. X address decoder 200 and Y gate 300 are connected to memory cell array 100 respectively for selecting rows and columns of memory cell array 100.

Y address decoder 400 for applying data of column selection is connected to Y gate 300. Address buffer 500 for storing an address information temporarily is connected to each of X address decoder 200 and Y address decoder 400.

Write circuit 600 is connected to Y gate 300 for carrying out write operation at the time of data input/output. Also, sense amplifier 700 is connected to Y gate 300 for determining "0" or "1" based on a current value during data output. Input/output buffer 800 for storing input/output data temporarily is connected to write circuit 600 and sense amplifier 700.

Control logic 900 is connected to address buffer 500 and input/output buffer 800 for controlling an operation of the flash memory. The control logic 900 operates based on an chip enable signal, an output enable signal, and a program signal.

Referring to FIG. 11, connections between the memory transistors formed within memory cell array 100 and the above-mentioned respective elements will now be described. FIG. 11 is an equivalent circuit showing a schematic structure of memory cell array 100 shown in FIG. 10.

Referring to FIG. 11, a plurality of word lines $WL_1$, $WL_2$, ..., $WL_i$ extending along rows and a plurality of bit lines $BL_1$, $BL_2$, ..., $BL_j$ extending along columns are arranged such that respective word lines and bit lines are perpendicular to each other. Memory transistors $Q_{11}$, $Q_{12}$, ..., $Q_{ij}$, each having a floating gate electrode, are provided at crossings of respective word lines and bit lines.

Each memory transistor has its drain connected to each bit line. Also, each memory transistor has its control gate electrode connected to each word line. The memory transistors have their sources connected to respective source lines $S_1$, $S_2$, ..., $S_i$. The sources of memory transistor included in the same row are connected with each other, as shown in FIG. 11.

FIG. 12 is a cross sectional view of a memory transistor included in the above-described flash memory. The memory transistor shown in FIG. 12 is called a stacked gate-type memory transistor. FIG. 13 is a schematic plan view showing a planar layout of conventional stacked gate-type flash memory. FIG. 14 is a cross section taken along XIV—XIV line of FIG. 13. Referring to these figures, a structure of the conventional flash memory will now be described in more detail.

Referring to FIGS. 12 and 14, an n-type drain region 103 and an n-type source region 105 are formed spaced apart from each other in a p-type impurity region 104 provided at a main surface of a silicon substrate 101. A control gate electrode 113 and a floating gate electrode 109 are stacked on a region between drain region 103 and a source region 105 such that a channel is formed therebetween.

Floating gate electrode 109 is formed on a main surface of p-type impurity region 104 with a thin tunnel insulating film 107 of about 100 Å in thickness interposed therebetween. Control gate electrode 113 is formed on floating gate electrode 109 with an interlayer insulating film 111 interposed therebetween so as to be isolated electrically from floating gate electrode 109. In this case, insulating layer 111 is formed stacked by a silicon oxide film 111a, a silicon nitride film 111b, and a silicon oxide film 111c.

Floating gate electrode 109 is formed of polycrystalline silicon. Control gate electrode 113 is formed of polycrystalline silicon or by a stacked film of polycrystalline silicon and a refractory metal. A sidewall insulating film 114 is formed on the side of the stacked structure of floating gate electrode 109, insulating layer 111 and control gate electrode 113. A silicon oxide film 115 and a silicon nitride film 116 are formed covering sidewall insulating film 114 and control gate electrode 113.

A smooth coat film 123 is formed on silicon nitride film 116 as shown in FIG. 14. A contact hole 122 is formed at a predetermined position (a region on drain region 103) of smooth coat film 123. A bit line 117 is formed to cover smooth coat film 123 and the inner surface of contact hole 122. Bit line 117 is connected electrically to drain region 103 via a drain contact 121.

Referring to FIG. 13, control gate electrodes (word lines) 113 are connected with each other and extend laterally (in the direction of rows). Bit lines 117 are arranged so as to cross word lines 113 perpendicularly. Bit lines 117 are connected electrically to drain regions 103 arranged longitudinally (in the direction of columns) via drain contacts 121.

Thus, drain regions 103 arranged longitudinally are connected with each other. Source region 105 is formed in a region surrounded by word line 113 and field oxide film 119 and extends along word line 113, as shown in FIG. 13. Each drain region 103 is also formed in the region surrounded by word line 113 and field oxide film 119.

An operation of the flash memory having the above structure will now be described referring to FIG. 12.

First, the write operation will be described referring to FIG. 12. In the write operation, a voltage $V_D$ of about 6

V—about 8 V is applied to drain region 103 and a voltage $V_G$ of about 10 V—about 15 V is applied to control gate electrode 113. Source region 105 and p-type impurity region 104 are held at the ground potential. Accordingly, a current of about several hundreds μA flows in the channel region of the memory transistor.

At this time, electrons flow from source region 105 toward drain region 103. Among these electrons, the ones accelerated in the vicinity of drain region 103 come to have high energy in the vicinity of drain region 103, which are so-called channel hot electrons.

These electrons are injected into floating gate electrode 109, as indicated by an arrow ① in FIG. 12, by an electric field generated by the voltage $V_G$ applied to control gate 113. Thus, electrons are stored in floating gate electrode 109. Accordingly, threshold voltage $V_{th}$ of the memory transistor becomes higher than a predetermined value. This state in which threshold voltage $V_{th}$ of the memory transistor becomes higher than the predetermined value is called written (programmed) state, which corresponds to "0".

Next, the erase operation will be described. In the erase operation, a voltage $V_S$ of about 10 V—about 12 V is applied to source region 105, while control gate electrode 113 and p-type impurity region 104 are held at the ground potential. At this time, drain region 103 is held at a floating state.

By an electric field generated by the voltage $V_S$ applied to source region 105, electrons in floating gate electrode 109 pass through the thin tunnel insulating film 107 by the tunnel effect, as indicated by an arrow ② in FIG. 12.

Thus, threshold voltage $V_{th}$ of the memory transistor becomes lower than the predetermined value, because the electrons in floating gate electrode 109 are pulled out. This state in which threshold voltage $V_{th}$ of the memory transistor is lower than the predetermined value is called an erased state which corresponds to "1". Source regions 105 of respective memory transistors are connected with each other as shown in FIG. 13. Therefore, all the data of memory cells can be eased at a time by this erase operation.

The read operation will now be described. In the read operation, a voltage $V_G'$ of about 5 V is applied to control gate electrode 113 and a voltage $V_D'$ of about 1 V— about 2 V is applied to drain region 103. At this time, determination of "1" or "0" is carried out based on whether or not a current flows in the channel region of the memory transistor, in other words, the memory transistor is turned on or turned off.

A method of manufacturing the flash memory having the above structure will now be described referring to FIGS. 15–24. FIGS. 15–24 are sectional views showing the first to eighth steps of the process of manufacturing the flash memory. FIG. 19 is a sectional view taken along line XIX-XIX in FIG. 18, and FIG. 22 is a sectional view taken along line XXII—XXII in FIG. 21.

Referring to FIG. 15, a silicon oxide film 102 having a thickness of about 300 Å is formed at a main surface of p-type <100> silicon substrate 101. Then, boron (B) is implanted through silicon oxide film 102 into a region where a p-type impurity region is to be formed at the main surface of silicon substrate 101 with 100 KeV and $1.0 \times 10^{13}/cm^2$.

Referring to FIG. 16, p-type impurity region 104 is formed by diffusing the impurity (B) implanted into silicon substrate 101 at 1200° C. for six hours. After that, silicon oxide film 102 is removed.

Referring to FIG. 17, a silicon oxide film 107 having a thickness of about 100 Å is formed by the thermal oxidation method on the entire main surface of p-type impurity region 104. This will be tunnel insulating film 107.

A polycrystalline silicon layer 108 having a thickness of about 1000 Å is formed by the CVD (Chemical Vapor Deposition) method on tunnel insulating film 107. This polycrystalline silicon layer 108 serves as floating gate electrode 109. Then, a resist pattern 106 patterned to have the shape of floating gate electrode 109 is formed on polycrystalline silicon layer 108.

Polycrystalline silicon layer 108 is etched using resist pattern 106 as a mask. FIG. 19 shows a sectional structure taken along line XIX—XIX of FIG. 18. After patterning polycrystalline silicon layer 108 as above, resist pattern 106 is removed.

Referring to FIG. 20, silicon oxide film 111a having a thickness of about 150 Å is formed by the CVD method or the like on polycrystalline silicon layer 108. Then, silicon nitride film 111b having a thickness of about 150 Å is formed by the CVD method or the like on silicon oxide film 111a. After that, silicon oxide film 111c having a thickness of about 20 Å is formed on silicon nitride film 111b by thermal oxidation of silicon nitride film 111b.

Accordingly, insulating layer 111 is formed by those silicon oxide films 111a, 111c and silicon nitride film 111b. Polycrystalline silicon layer 110 having a thickness of about 2500 Å is then formed by the CVD method or the like on silicon oxide film 111c. This polycrystalline silicon layer 110 serves as control gate electrode 113.

Referring to FIG. 21, a resist pattern 112 patterned into a predetermined shape is formed on polycrystalline silicon layer 110. Using the resist pattern 112 as a mask, polycrystalline silicon layer 110, silicon oxide film 111c, silicon nitride film 111b, silicon oxide film 111a, and polycrystalline silicon layer 108 are etched successively.

Thus, as shown in FIG. 21, control gate electrode 113 and floating gate electrode 109 are formed. A sectional view taken along line XXII—XXII in FIG. 21 is shown in FIG. 22.

Resist pattern 112 is then removed. As shown in FIG. 23, sidewall insulating film 114 is formed on the side of the stacked structure of floating gate electrode 109 and control gate electrode 113 by the CVD method, the etchback method or the like.

Silicon oxide film 115 is formed by the CVD method or the like on sidewall insulating film 114 and control gate electrode 113. Then, silicon nitride film 116 is formed by the CVD method or the like on silicon oxide film 115. After that, smooth coat film 123 is formed on silicon nitride film 116.

Referring to FIG. 24, contact hole 122 is formed by etching or the like at a position located on drain region 103. Then, an aluminum interconnection layer (bit line) 117 is formed by sputtering or the like on smooth coat film 123 and the inner surface of contact hole 122. Bit line 117 is connected electrically to drain region 103 via drain contact 121.

A smooth coat film 118 is formed again on aluminum interconnection layer 117. An aluminum interconnection layer 120 is formed on smooth coat film 118 by sputtering or the like. The flash memory is thus formed through the above-mentioned steps.

Such flash memory, however, has the following problem. The silicon oxide film is used as tunnel insulating film 107 in the above-described flash memory. At the time of erasing, electrons pass through thin tunnel insulating film 107 formed of the silicon oxide film by tunnel effect.

As a result, the silicon oxide film is deteriorated because of the passage of electrons through tunnel insulating film 107 formed of the silicon oxide film, and repeated write/erase operations cause breakdown of tunnel insulating film 107.

One method for restraining the breakdown induced by the passage of electrons by utilizing a nitrided oxide (oxinitride) film obtained by thermal nitriding of the silicon oxide film or a re-oxidized nitrided oxide film obtained by thermal oxidation of the nitrided oxide film has been proposed in "Extended Abstracts of the 22nd Conference on Solid State Devices and Materials," Sendai, 1990, pp. 171–174 and "Applied Physics Letters" 60(121), 23 Mar. 1992, pp. 1489–1491.

As described in the above-mentioned references, the write/erase characteristics of the flash memory can be improved to some extent by thermally nitriding or thermally nitriding and thermally oxidizing the silicon oxide film, compared to the case when the silicon oxide film itself is used as tunnel insulating film 107. Even in this case, however, the following two problems exist.

The first problem will be described referring to FIGS. 25–27. FIG. 25 is a sectional view of the memory transistor when the nitrided oxide film or the re-oxidized nitrided oxide film is used as tunnel insulating film 107a. FIG. 26 shows the distribution of concentration of nitrogen included in tunnel insulating film 107a and regions in the vicinity thereof after the thermal nitriding or the thermal nitriding and thermal oxidation.

FIG. 27 shows the relationship between the cumulative failure rate (%) and the density of electric charges passed through the tunnel insulating film Qinj (C/cm$^2$) in the case when the silicon oxide film is used as the tunnel insulating film (I) and when the re-oxidized nitrided oxide film is used as the tunnel insulating film (IIb, IIa).

In FIG. 27, (I) shows the case when electrons are passed in the same direction as in the erase operation utilizing as tunnel insulating film 107a the silicon oxide film obtained by thermal oxidation of the silicon substrate. (IIa) shows the case when electrons are passed in the direction reverse to that in the erase operation utilizing the re-oxidized nitrided oxide film as tunnel insulating film 107a. (IIb) shows the case when electrons are passed in the same direction as in the erase operation utilizing the re-oxidized nitrided oxide film as tunnel insulting film 107a. The above-mentioned cumulative failure rate (%) means the cumulative failure rate of devices failed by breakdown of tunnel insulating film 107a when the silicon oxide film or the re-oxidized nitrided oxide film is used as tunnel insulating film 107a.

Referring to FIG. 25, electrons are injected into floating gate electrode 109 from silicon substrate 101 by the channel hot electrons during writing of data. Referring to FIG. 26, tunnel insulating film 107a is formed by thermally nitriding and thermally oxidizing to the silicon oxide film after forming the silicon oxide film on silicon substrate 101.

Thus, as shown in FIG. 26, the top surface of tunnel insulating film 107a and an interface 125 between silicon substrate 101 and tunnel insulating film 107a are mainly nitrided. A nitrided portion D of silicon substrate 101 is thus formed at the interface between silicon substrate 101 and tunnel insulating film 107a.

Electrons are moved in the same direction as in the write operation and passed through tunnel insulating film 107a. The electrons pass through tunnel insulating film 107a via the above-mentioned nitrided portion D, as indicated by ① in FIG. 26. The electrons are then injected into floating gate electrode 109.

As a result, as shown by (IIa) in FIG. 27, the value of electric charge density relative to the cumulative failure rate increases as compared to (I) when tunnel insulating film 107a is formed by the silicon oxide film. In other words, resistance of tunnel insulating film 107a is increased.

Referring again to FIG. 25, at the time of erasing, electrons are extracted from floating gate electrode 109 to source region 105 by tunnel effect within region B. The region where electrons pass through tunnel insulating film 107a by the tunnel effect is called "tunnel region" hereinafter in the present specification.

In this case, as indicated by ② in FIG. 26, electrons pass through the nitrided portion on the top surface of tunnel insulating film 107a. Then, the electrons pass through tunnel insulating film 107a into source region 105. Thus, at the time of erasing, the electrons first pass through the nitrided portion of tunnel insulating film 107a itself, unlike the case of writing.

The electrons move in the same direction as in the above-described erase operation, and pass through tunnel insulating film 107a. Consequently, as shown by (IIb) in FIG. 27, the value of electric charge density relative to the cumulative failure rate becomes smaller than (I) when tunnel insulating film 107a is formed of the silicon oxide film. In other words, endurance of tunnel insulating film 107a is deteriorated.

As described above, if a thermally nitrided or thermally nitrided and thermally oxidized tunnel insulating film 107a is used, when electrons are moved from silicon substrate 101 to floating gate electrode 109 (in the direction of writing), endurance of the tunnel insulating film 107a improves, but when electrons are moved from floating gate electrode 109 to source region 105 (in the direction of erasing), endurance of tunnel insulating film 107a deteriorates as compared to the case when the silicon oxide film is used.

Therefore, even when thermally nitrided or thermally nitrided and thermally oxidized tunnel insulating film 107a is used, the write/erase characteristics of the flash memory cannot be improved sufficiently.

The second problem will now be described referring to FIGS. 28 and 29. FIG. 28 is a plan view showing a memory transistor including thermally nitrided or thermally nitrided and thermally oxidized tunnel insulating film 107a. FIG. 29 shows a sectional structure taken along line XXIX—XXIX in FIG. 28 and the distribution of nitrogen concentration in the top surface of tunnel insulating film 107a.

Referring to FIG. 28, when tunnel insulating film 107a is thermally nitrided or the thermally nitrided and thermally oxidized, the entire top surface of tunnel insulating film 107a is nitrided. Thus, a portion on a channel region 124 in the memory transistor is also nitrided. More specifically, as shown in FIG. 29, the entire top surface of tunnel insulating film 107a including the region on channel region 124 are nitrided almost uniformly.

The following problem is generated by nitriding the portion of tunnel insulating film 107a located on channel region 124. As disclosed in "International Electron Device Meeting" 1991, pp. 649–652, driving capability of the transistor at low voltages decreases when tunnel insulating film 107a having the entire surface thereof nitrided is used. In other words, when the nitrided oxide film or the re-oxidized nitrided oxide film is used as tunnel insulating film 107a, driving capability of the memory transistor at low voltages is deteriorated.

SUMMARY OF THE INVENTION

The present invention is made to solve the above-described problems. One object of the present invention is to provide a non-volatile semiconductor memory device which can improve write/erase characteristics thereof and a method of manufacturing the same.

Another object of the present invention is to provide a non-volatile semiconductor memory device which can improve write/erase characteristics thereof without decreasing driving capability of a memory transistor at a low voltage and a method of manufacturing the same.

In one aspect, a non-volatile semiconductor memory device according to the present invention includes a semiconductor substrate of a first conductivity type having a main surface, an impurity region of a second conductivity type formed at a main surface of the semiconductor substrate, a tunnel insulating film formed on the impurity region, and a charge storage electrode (an electrode for storing charges) formed on the tunnel insulating film, wherein a nitride layer of the electrode for storing charges is formed at an interface between the electrode for storing charges and the tunnel insulating film located in a tunnel region, where electrons move to and from the impurity region and the electrode for storing charges by tunnel effect.

As described above, in the non-volatile semiconductor memory device according to the present invention, the nitride layer of the electrode for storing charges is formed at the interface between the electrode for storing charges and the tunnel insulating film. Thus, when moving from the electrode for storing charges to the semiconductor substrate, electrons first pass through the interface between the nitride layer made of the electrode for storing charges and the tunnel insulating film, and then pass through the tunnel insulating film. Accordingly, as in the case shown by (IIa) in FIG. 27, endurance of the tunnel insulating film to the passage of electrons can be improved compared to the case when the electrons pass through the tunnel insulating film without first passing through the interface between the above-mentioned nitride layer and the tunnel insulating film. Consequently, breakdown of the tunnel insulating film induced by repeated write/erase operations can be restrained more effectively than before.

In another aspect, a non-volatile semiconductor memory device according to the present invention includes a semiconductor substrate of a first conductivity type having a main surface; a pair of impurity regions of a second conductivity type formed spaced apart from each other so as to define a channel region at the main surface of the semiconductor substrate; a tunnel insulating film formed on the channel region and the impurity regions; nitride layers of the semiconductor substrate formed with a predetermined space therebetween and partially overlapping the channel region in the vicinity of an interface between the tunnel insulating film and the semiconductor substrate and in a pair of regions within the semiconductor substrate including respective ends of the pair of impurity regions positioned on the side of the channel region; a floating gate formed on the tunnel insulating film; a nitride layer of the floating gate formed in a region in the vicinity of an interface between the floating gate and the tunnel insulating film and positioned above the nitride layers of the semiconductor substrate; and a control gate formed on the floating gate with an insulating layer interposed therebetween.

As described above, in another aspect of the non-volatile semiconductor memory device according to the present invention, nitride layers are formed at the interface between the semiconductor substrate and the tunnel insulating film as well as at the interface between the floating gate and the tunnel insulating film, respectively. In this case also, the breakdown of the tunnel insulating film can be restrained.

In still another aspect, a non-volatile semiconductor memory device according to the present invention includes a semiconductor substrate of a first conductivity type including a main surface; a pair of impurity regions of a second conductivity type spaced apart from each other so as to define a channel region at the main surface of the semiconductor substrate; a tunnel insulating film formed on the channel region and the impurity regions; a floating gate formed on the tunnel insulating film; and a control gate formed on the floating gate with an insulating layer interposed therebetween; wherein a nitrogen content at an interface between the floating gate and the tunnel insulating film positioned within a tunnel region where electrons move to and from the impurity regions and the floating gate by tunnel effect is greater than a nitrogen content at an interface between the floating gate and the tunnel insulating film positioned on the channel region.

As described above, in still another aspect of the non-volatile semiconductor memory device according to the present invention, the nitrogen content at the interface between the floating gate and the tunnel insulating film positioned within the tunnel region is greater than the nitrogen content at the interface between the floating gate and the tunnel insulating film positioned on the channel region. This can improve the driving capability of the memory transistor at a low voltage compared to the case when the nitrided oxide film or the re-oxidized nitrided oxide film formed by the conventional method is used as the tunnel insulating film.

In a method of manufacturing a non-volatile semiconductor memory device according to the present invention, a tunnel insulating film and a material of a charge storage electrode are formed on a semiconductor substrate successively. The electrode for storing charges is formed by patterning the material of the electrode for storing charges into a predetermined shape. By nitriding a stacked structure of the semiconductor substrate, the tunnel insulating film and the charge storage electrode, a nitride layer of the electrode for storing charges is formed at an interface between the tunnel insulating film and the electrode for storing charges positioned within the tunnel region where electrons move to and from the semiconductor substrate and the electrode for storing charges by tunnel effect.

As described above, in the method of manufacturing the non-volatile semiconductor memory device according to the present invention, the stacked structure of the semiconductor substrate, the tunnel insulating film and the electrode for storing charges is nitrided after forming the electrode for storing charges on the tunnel insulating film. This enables formation of the nitride layer of the electrode for storing charges at the interface between the electrode for storing charges and the tunnel insulating film.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
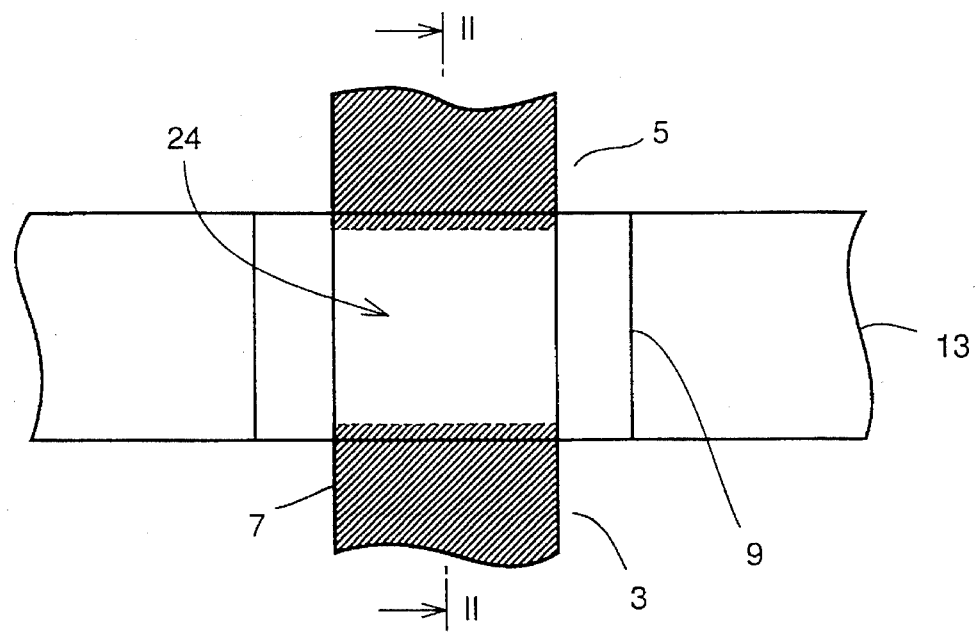
FIG. 1 is a plan view of a memory transistor included in a flash memory according to one embodiment of the present invention.
Figure 2:
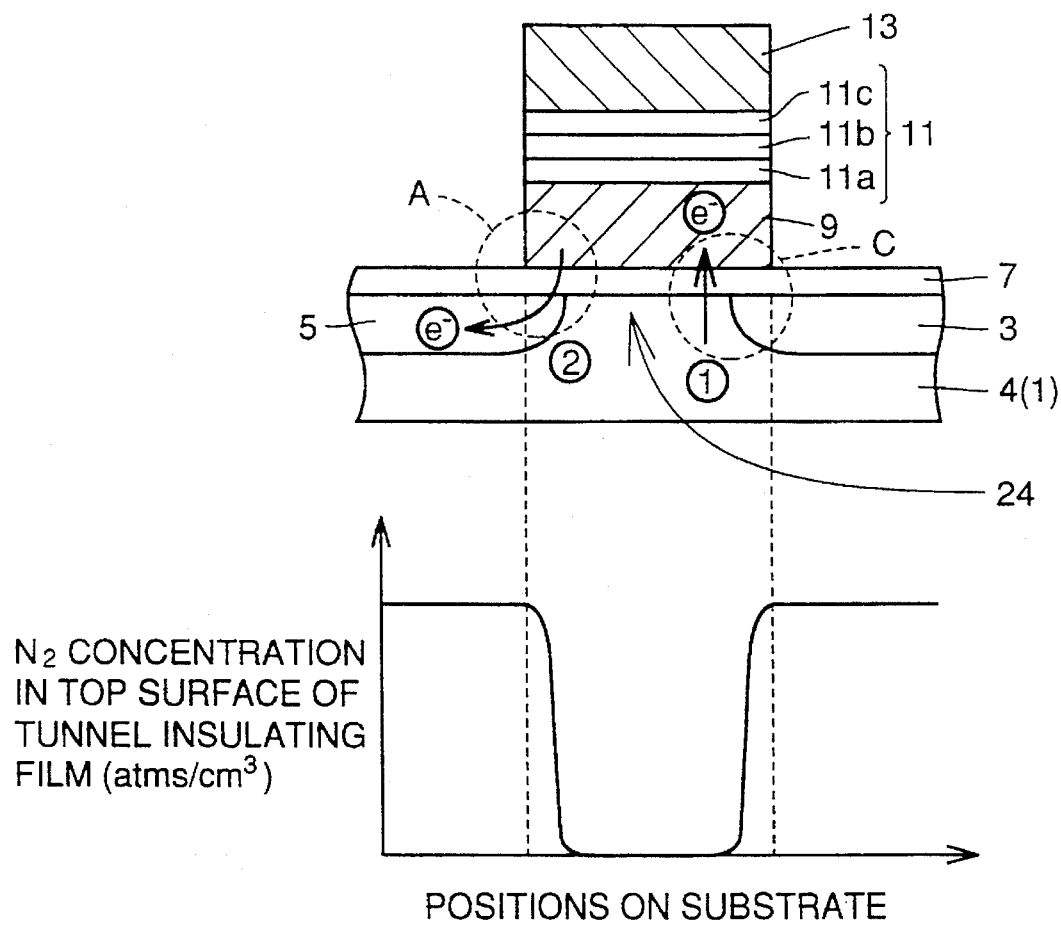
FIG. 2 includes a sectional view taken along line II—II in FIG. 1 and a graph showing the distribution of nitrogen concentration in a top surface of tunnel insulating film 7.
Figure 3:
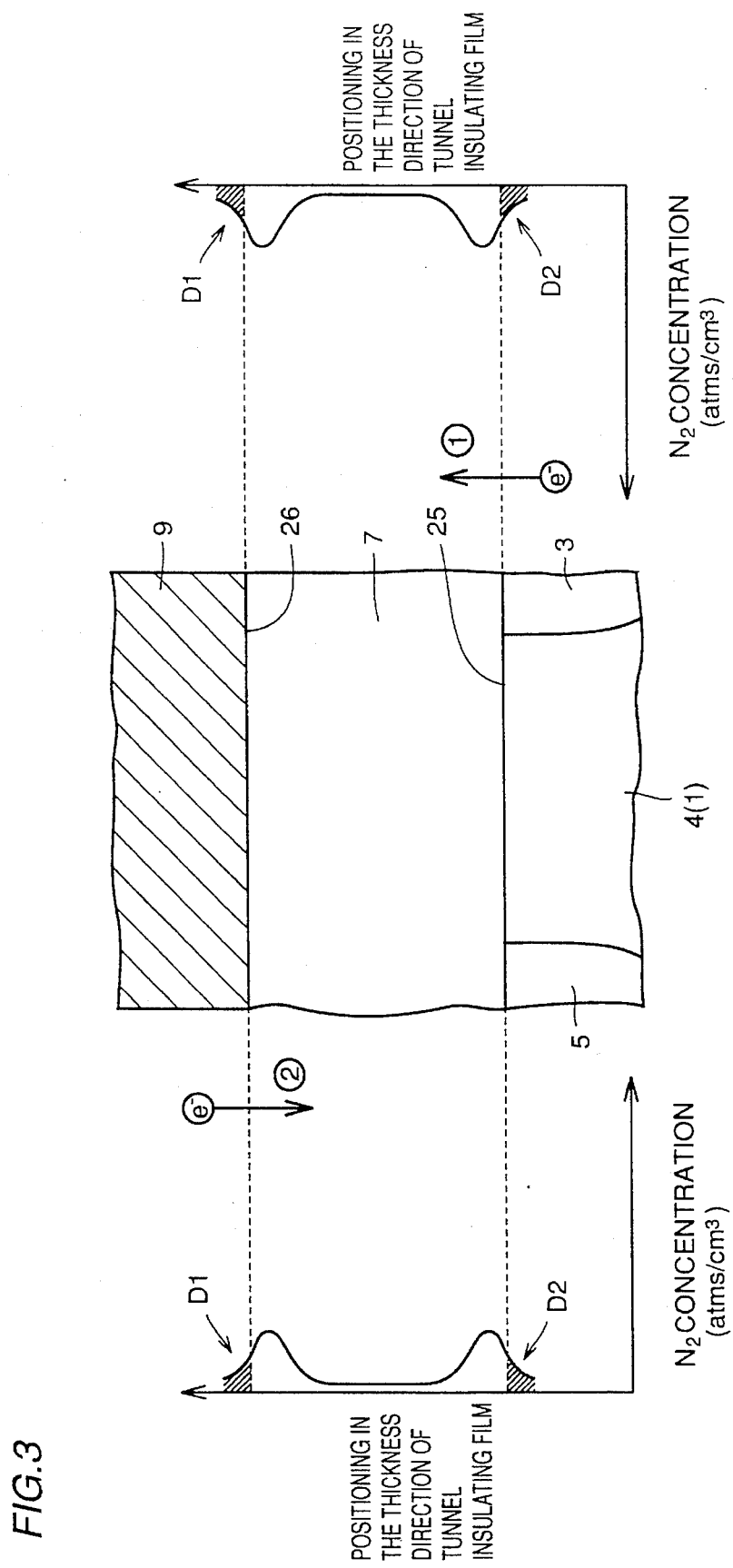
FIG. 3 includes an enlarged view in the vicinity of the channel region shown in FIG. 2 and graphs showing the distribution of nitrogen concentration in the vicinity of the tunnel insulating film therein.
Figure 4:
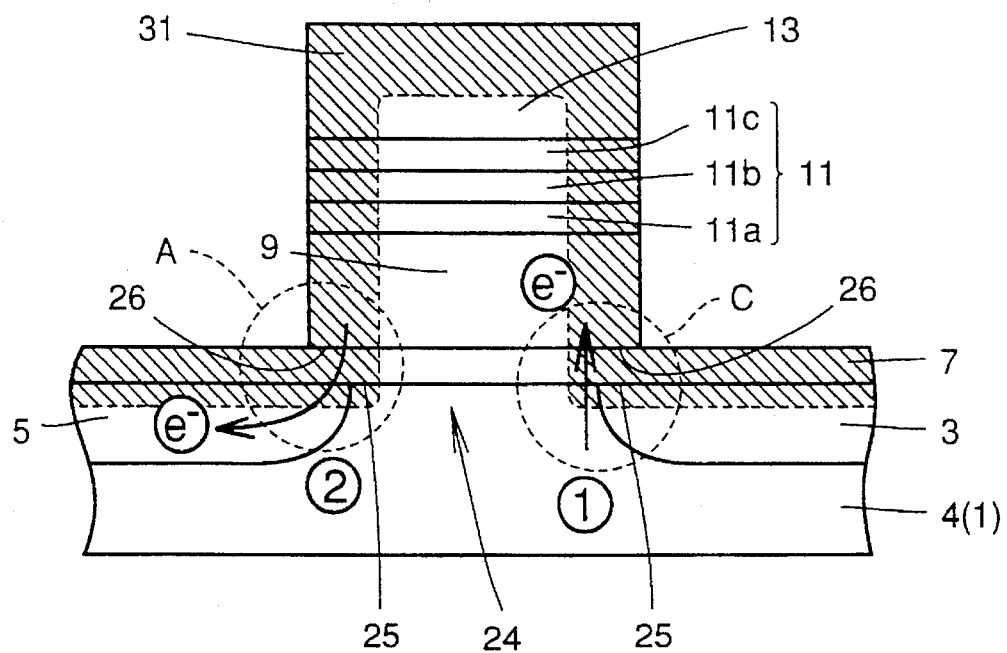
FIG. 4 is a schematic view showing a nitrided portion in the memory transistor formed according to the present invention.

Embodiments according to the present invention will now be described referring to FIGS. 1–9. FIG. 1 is a plan view showing a memory transistor formed according to the present invention. FIG. 2 includes a sectional view taken along line II—II of FIG. 1 and a graph showing the distribution of concentration of nitrogen included in a tunnel insulating film 7 of the memory transistor shown in FIG. 1. FIG. 3 includes an enlarged view of a channel region of the memory transistor shown in FIG. 2 and graphs showing the distribution of nitrogen concentration in tunnel insulating film 7, an interface 26 between tunnel insulating film 7 and a floating gate electrode (electrode for storing changes) 9, as well as an interface 25 between tunnel insulating film 7 and a silicon substrate 1. FIG. 4 is a schematic view showing a nitrided portion 31 in the memory transistor after nitriding thereof according to a manufacturing method of the present invention.

Referring to FIGS. 1 and 2, a memory transistor in a flash memory (non-volatile semiconductor memory device) according to the present invention includes an n-type drain region 3 and an n-type source region 5 formed spaced apart by a distance so as to define a channel region 24 within a p-type impurity region 4 formed at a main surface of silicon substrate 1.

Tunnel insulating film 7 is formed on channel region 24 and source/drain regions 5, 3. Floating gate electrode 9 formed of polycrystalline silicon or the like is formed on tunnel insulating film 7.

A control gate 13 is formed on floating gate electrode 9 with an insulating layer 11 interposed therebetween. In this case, insulating layer 11 includes a silicon oxide film 11a, a silicon nitride film 11b and a silicon oxide film 11c.

As shown in FIGS. 1 and 2, on channel region 24 of the memory transistor, tunnel insulating film 7 is hardly nitrided. Therefore, the driving capability of the memory transistor can be improved compared to that of the conventional memory transistor utilizing nitrided tunnel insulating film 7.

Referring to FIGS. 2–4, the operation and structure of the flash memory according to the present invention will be described in greater detail. Referring to FIG. 2, the basic operation is the same as that of the conventional example. More specifically, during the write operation (operation for injecting electrons from silicon substrate 1 into floating gate electrode 9), as shown by ① in the figure, electrons are injected into floating gate electrode 9 by channel hot electrons within region C.

Meanwhile, at the time of the erase operation (operation for moving electrons from floating gate electrode 9 to silicon substrate 1), electrons are extracted from floating gate electrode 9 to silicon substrate 1 by tunnel effect within region A (tunnel region).

Referring to FIG. 4, the memory transistor according to the present invention includes nitrided portion 31 at the surface thereof. Since this is derived from the manufacturing method thereof, it will be described in detail later. Within nitrided portion 31, portions located in regions A and C have a great influence on the endurance of the tunnel insulating film during operation of the memory transistor.

More specifically, the endurance of tunnel insulating film 7 is largely influenced by nitriding of interfaces including interface 26 between floating gate electrode 9 and tunnel insulating film 7 within region A, interface 25 between tunnel insulating film 7 and silicon substrate 1 within region A, interface 26 between floating gate electrode 9 and tunnel insulating film 7 within region C, and interface 25 between tunnel insulating film 7 and silicon substrate 1 within region C.

Referring to FIGS. 3 and 4, the relationship between operation of the memory transistor and the above-described nitrided portion will now be described. Referring to FIG. 4, since the above-described nitrided portion 31 is provided, interface 26 between floating gate electrode 9 and tunnel insulating film 7 located within region A (tunnel region) is nitrided. Therefore, as shown in FIG. 3, floating gate electrode 9 comes to have a nitrided portion D1 in the vicinity of interface 26.

At the same time, interface 25 between tunnel insulating film 7 and silicon substrate 1 located within region A is also nitrided. Thus, as shown in FIG. 3, a nitrided portion D2 of silicon substrate 1 is provided in the vicinity of interface 25 between tunnel insulating film 7 and silicon substrate 1. Tunnel insulating film 7 itself is nitrided partially at portions located in the vicinity of interfaces 25 and 26.

Similarly, in region C, as shown in FIG. 4, nitrided portions of floating gate electrode 9, tunnel insulating film 7 and silicon substrate 1 are respectively provided in the vicinity of interfaces 25 and 26. Accordingly, interface 25 similar to that in the conventional example when the thermal nitriding or the like is conducted thereto can be obtained. Consequently, the same write characteristic as in the conventional case when the thermal nitriding is conducted can be obtained.

Having the above-described structure, hot electrons in silicon substrate 1 first pass through nitrided portion D2 of silicon substrate 1 as indicated by ① in FIG. 3 at the time of write operation (operation for injecting electrons from silicon substrate 1 to floating gate electrode 9). The electrons then pass through tunnel insulating film 7 to floating gate electrode 9.

Therefore, as in the case when tunnel insulating film 107 is thermally nitrided or thermally nitrided and thermally oxidized, the endurance of tunnel insulating film 7 in this portion is improved against the passage of electrons comparing to the case when the silicon oxide film is used as the material of tunnel insulating film 7.

On the other hand, at the time of erase operation (operation for extracting electrons from floating gate electrode 9 to silicon substrate 1), as indicated by ② in FIG. 3, electrons first pass through nitrided portion D1 of floating gate electrode 9 and the nitrided portion of tunnel insulating film 7 so as to be injected into tunnel insulating film 7. Then, the electrons pass through the nitrided portion of tunnel insulating film 7 and nitrided portion D2 of silicon substrate 1 to reach source region 5.

As in the write operation, the electrons are injected into tunnel insulating film 7 after being passed through nitrided portion D1 of floating gate electrode 9. In this respect, the inventors have assumed that the endurance of the tunnel insulating film 7 can be improved also in the erase operation.

Figure 9:
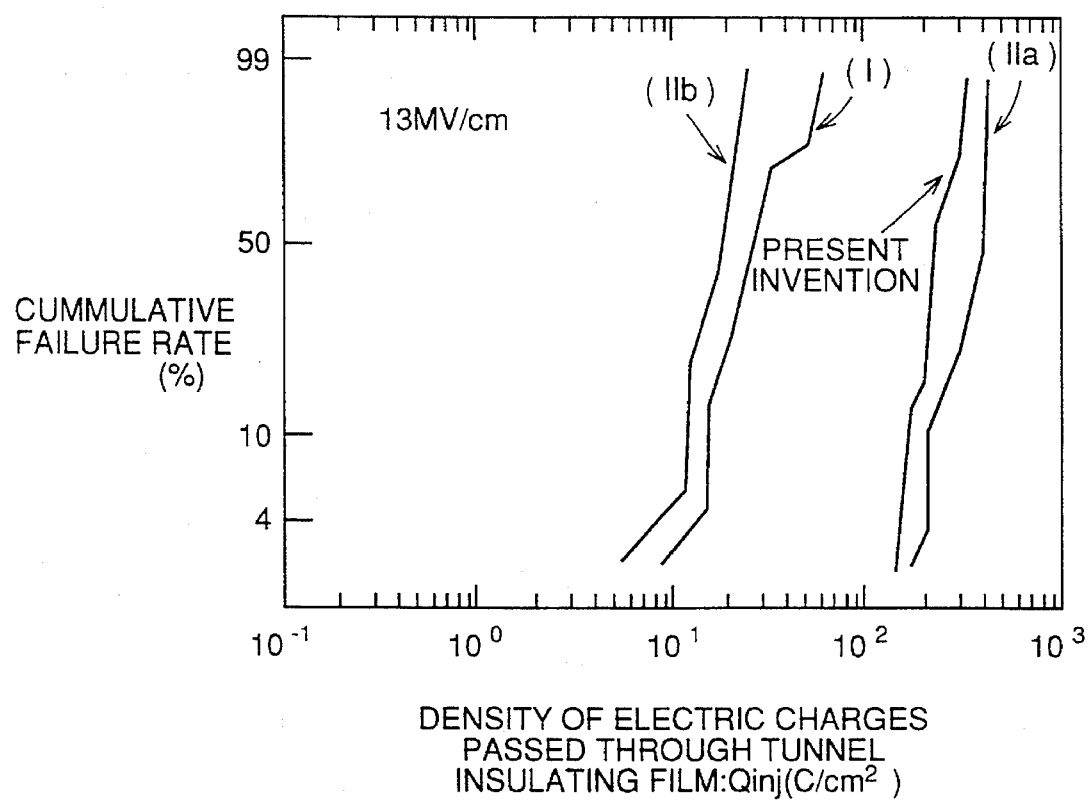
FIG. 9 is a graph showing the relationship between the cumulative failure rate (%) and the density Qinj (C/cm$^2$) of electric charges passed through the tunnel insulating film in respect of the flash memory according to the present invention and a conventional flash memory.
Figure 10:
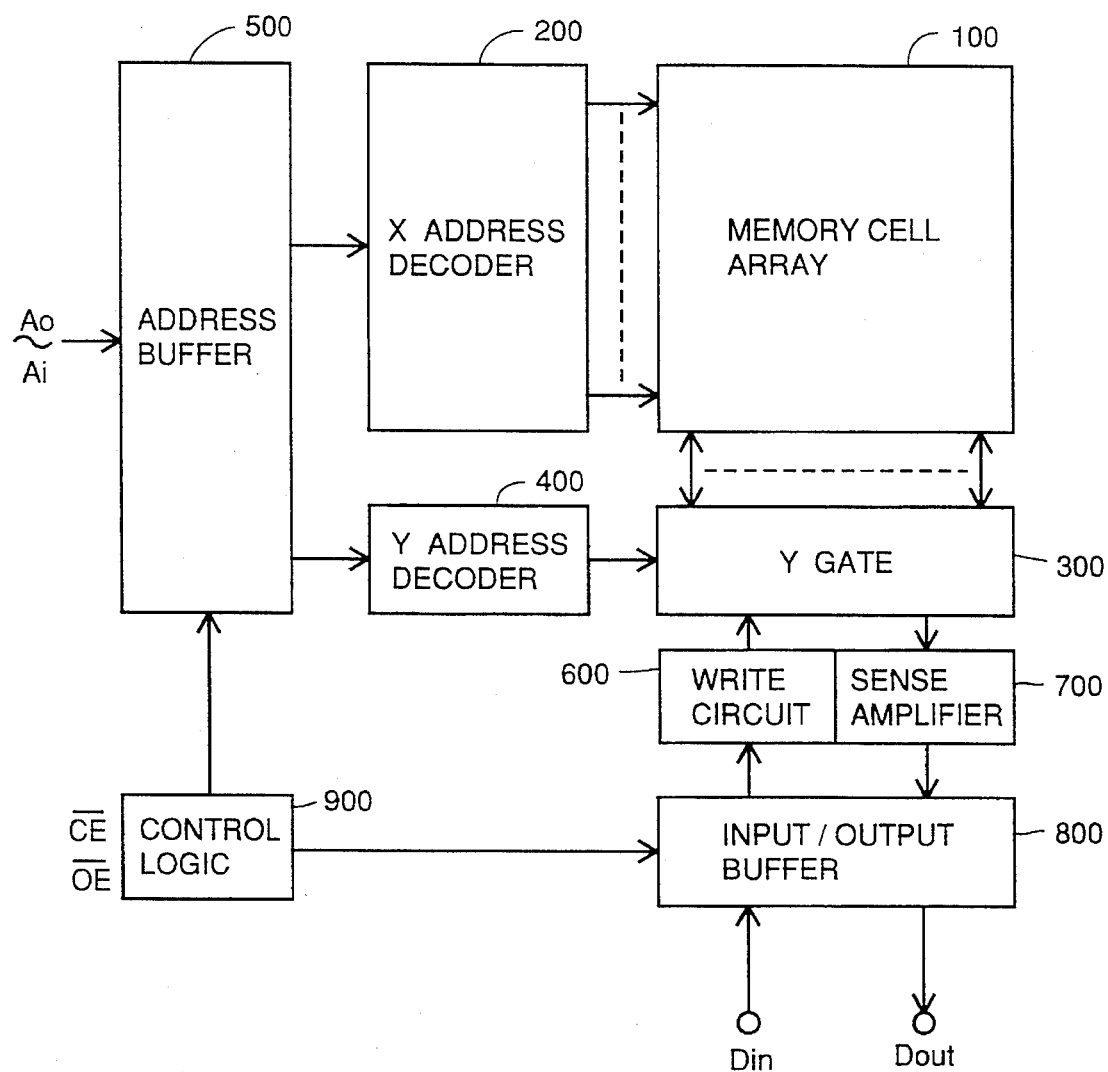
FIG. 10 is a block diagram showing an ordinary structure of a flash memory.
Figure 11:
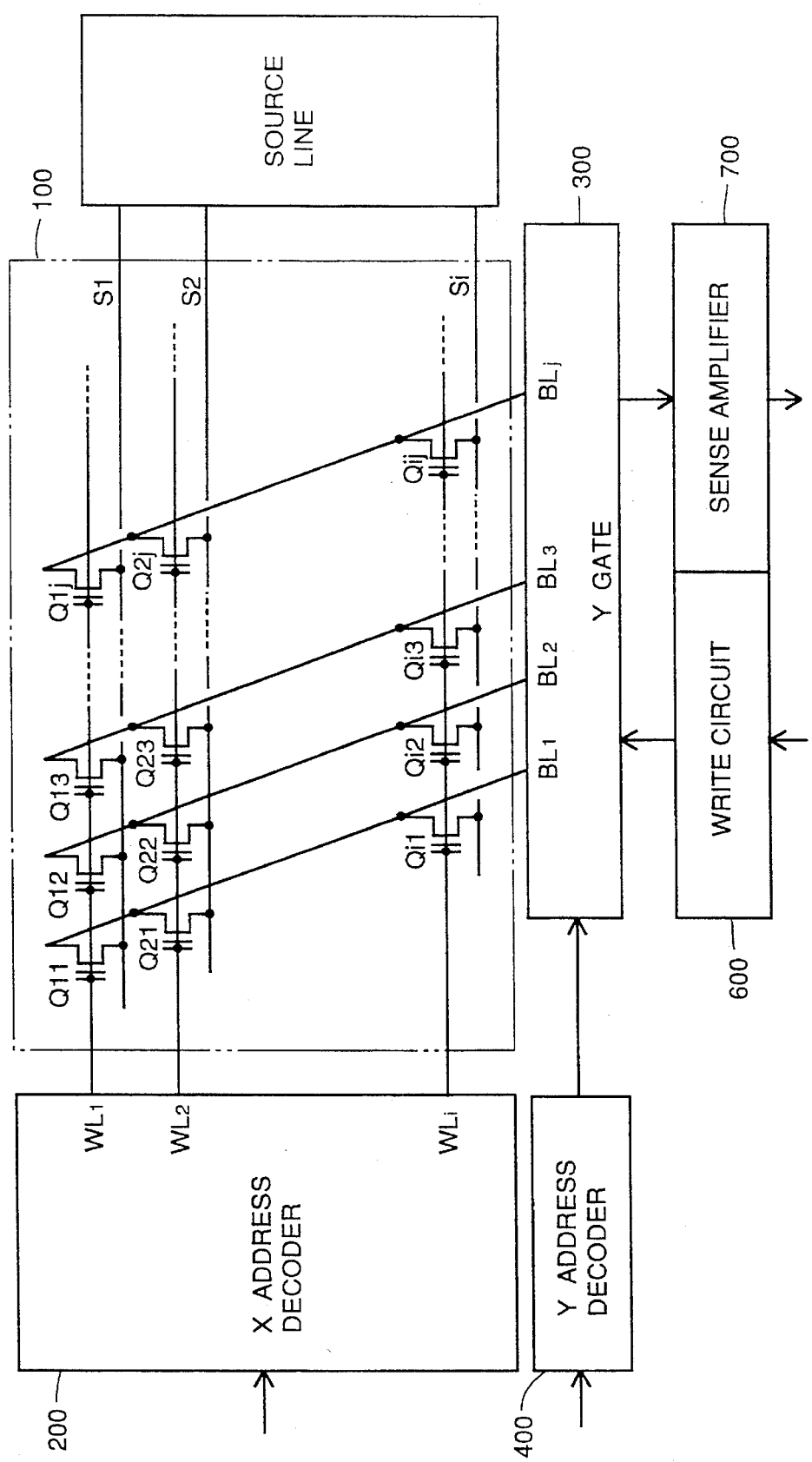
FIG. 11 is an equivalent circuit diagram showing a schematic structure of a memory cell array shown in FIG. 10.
Figure 12:
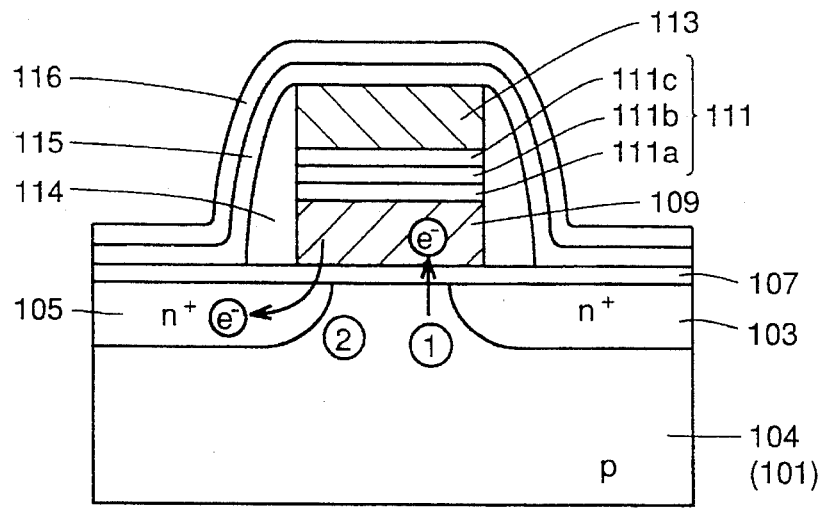
FIG. 12 is a view showing a sectional structure of a memory transistor constituting the flash memory.
Figure 13:
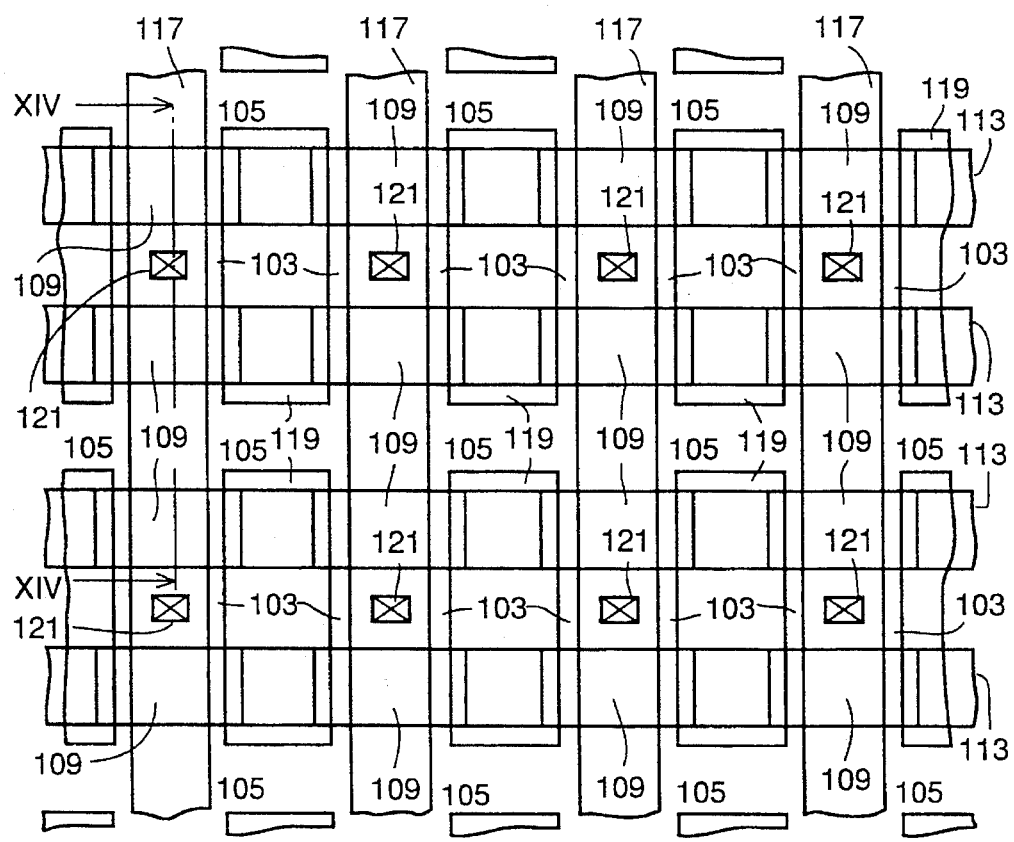
FIG. 13 is a schematic plan view showing a planar layout of a conventional stacked gate-type flash memory.
Figure 14:
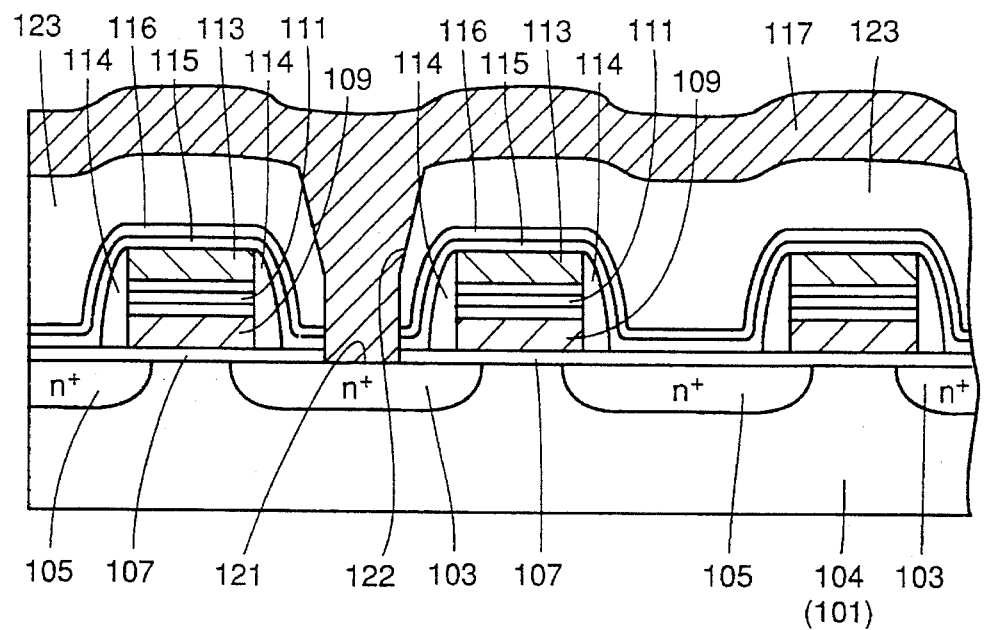
FIG. 14 is a sectional view taken along line XIV—XIV of FIG. 13.
Figure 15:
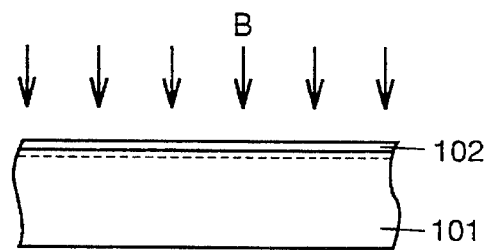
FIGS. 15–18 are sectional views showing the first to fourth steps of a manufacturing process of the conventional flash memory.
Figure 16:
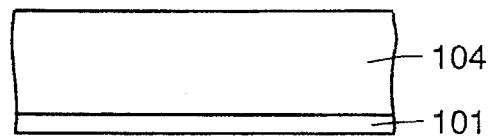
Figure 17:
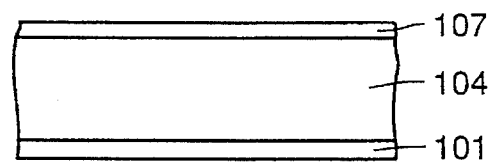
Figure 18:
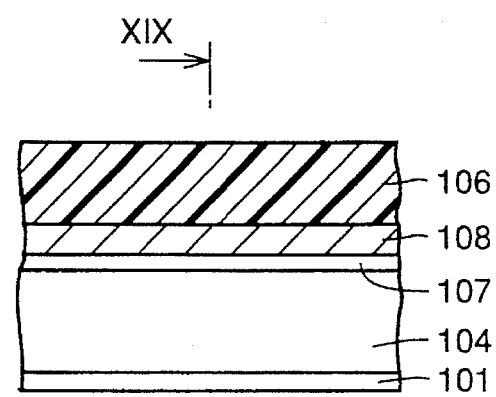
Figure 19:
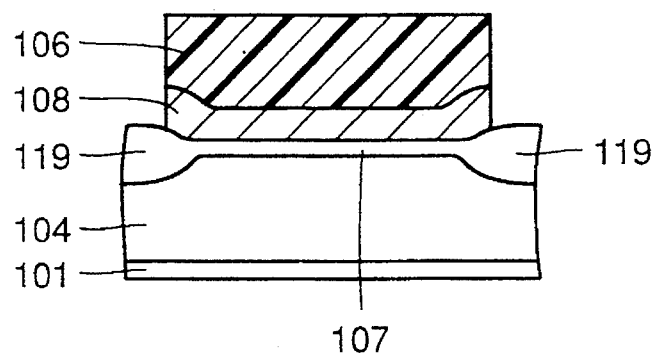
FIG. 19 is a sectional view taken along line XIX—XIX of FIG. 18.
Figure 20:
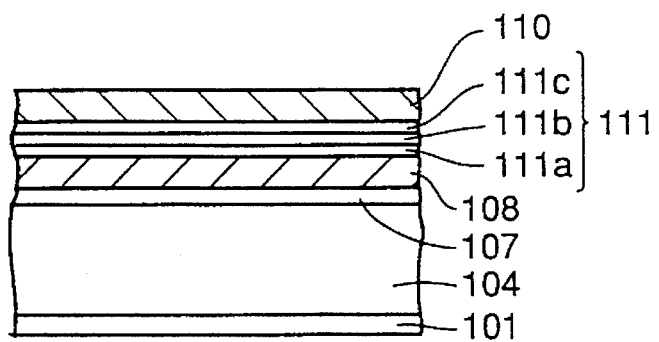
FIGS. 20 and 21 are sectional views showing the fifth and sixth steps of the manufacturing process of the conventional flash memory.
Figure 21:
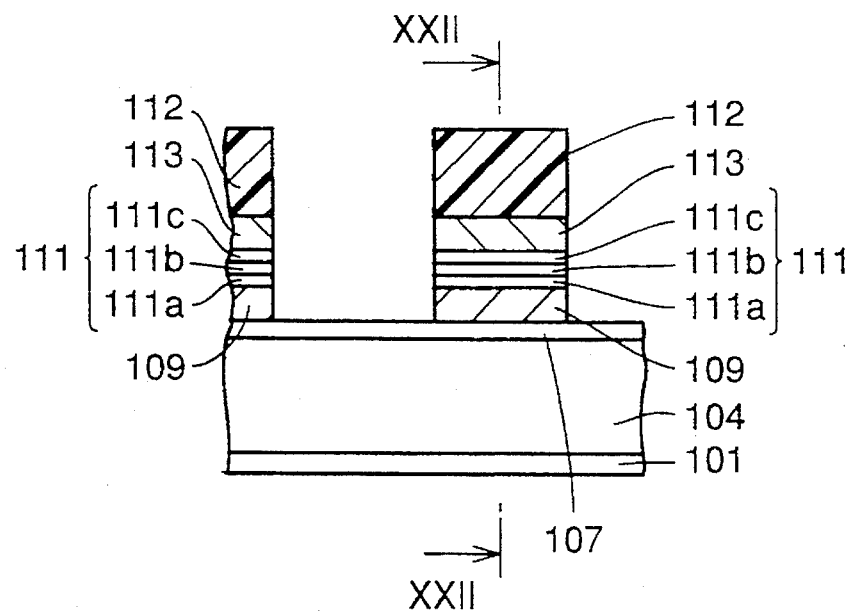
Figure 22:
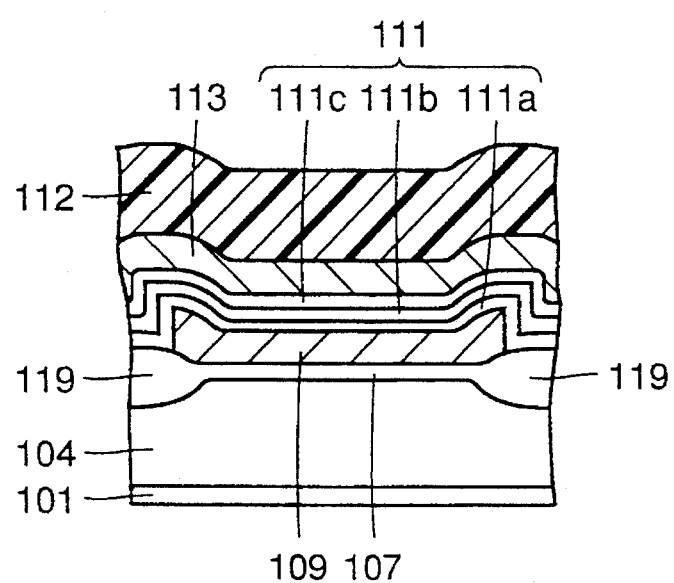
FIG. 22 is a sectional view taken along line XXII—XXII of FIG. 21.
Figure 23:
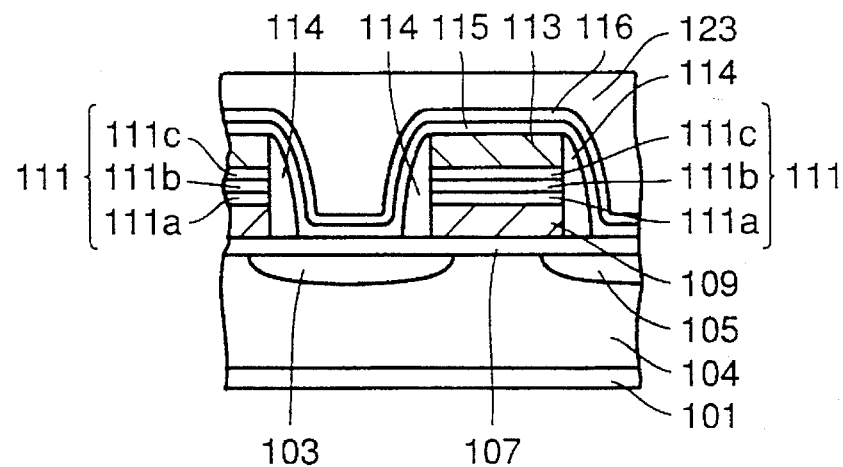
FIGS. 23 and 24 are sectional views showing the seventh and eighth steps of the manufacturing process of the conventional flash memory.
Figure 24:
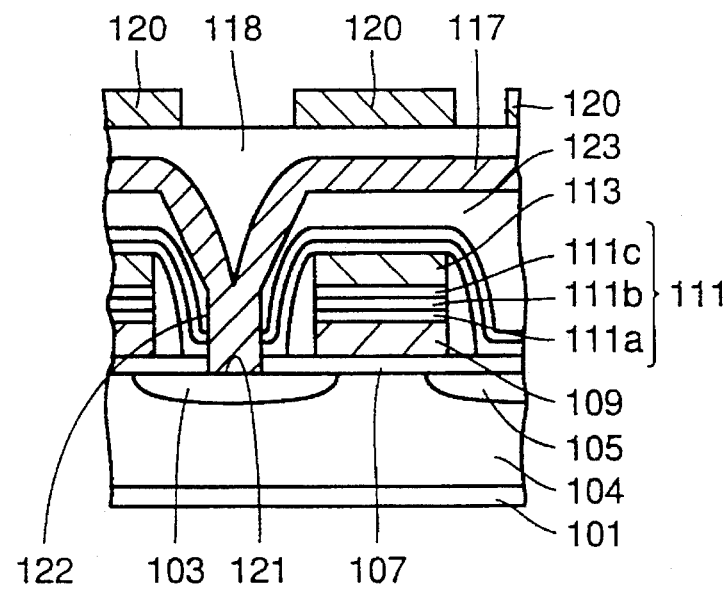
Figure 25:
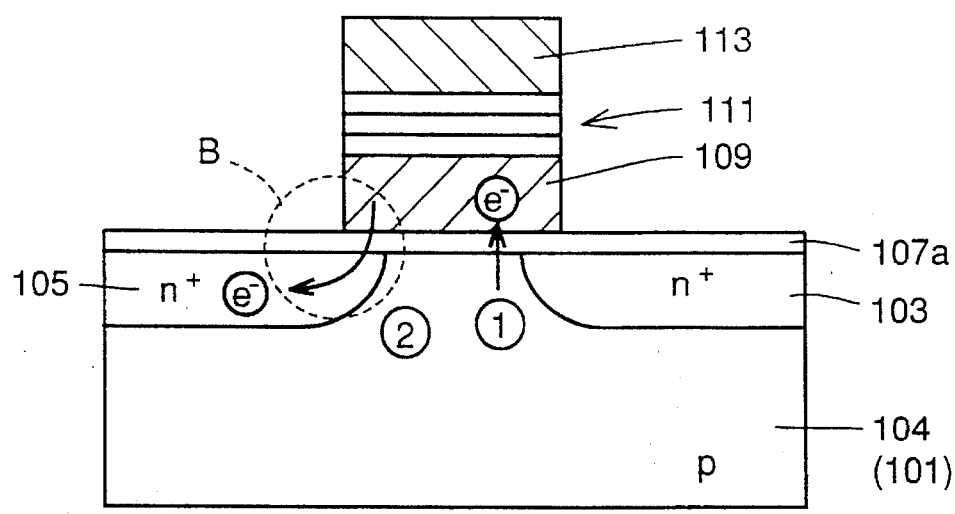
FIG. 25 is a sectional view showing the memory transistor utilizing a nitrided oxide film or a re-oxidized nitrided oxide film as the tunnel insulating film.
Figure 26:
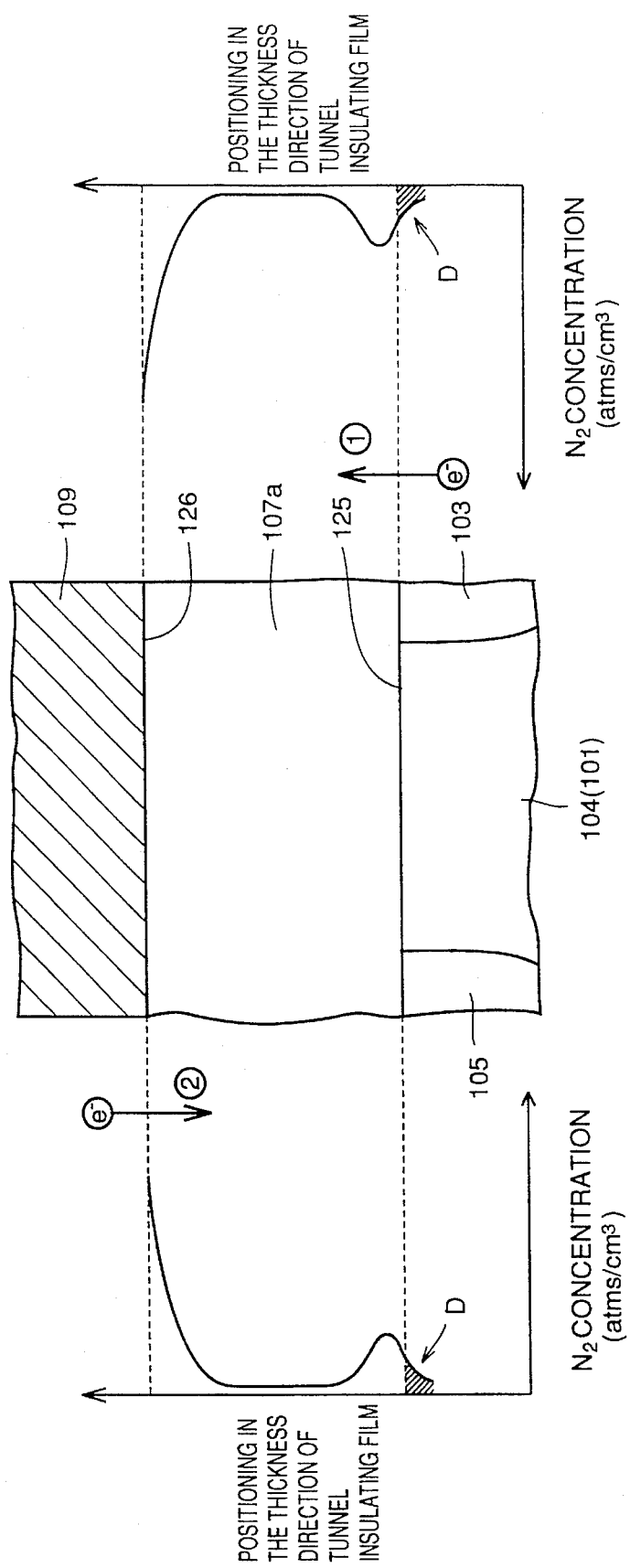
FIG. 26 includes an enlarged sectional view in the vicinity of the channel region of the memory transistor shown in FIG. 25 and graphs showing the distribution of concentration of nitrogen included in the tunnel insulating film and in the vicinity thereof.
Figure 27:
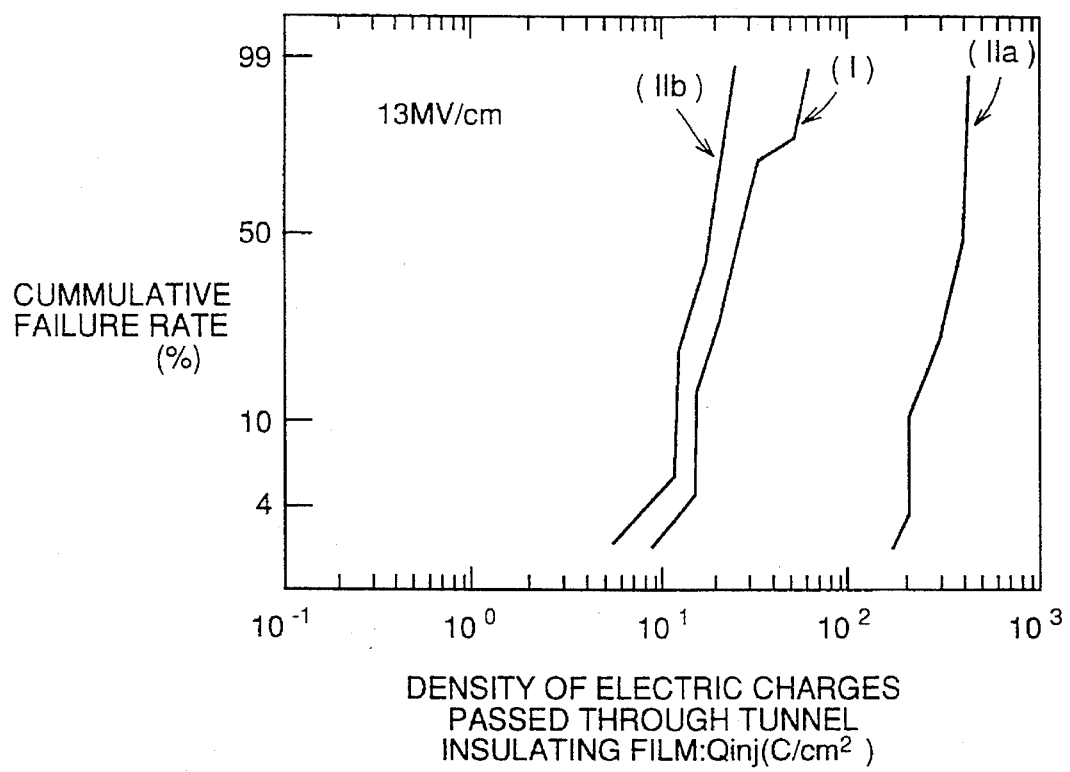
FIG. 27 is a graph showing the relationship between the cumulative failure rate (%) and the density Qinj (C/cm$^2$) of electric charges passed through tunnel insulating film in the case of (I) when the silicon oxide film is used as the tunnel insulating film and the case (IIa, IIb) when the re-oxidized nitrided oxide film is used as the tunnel insulating film.
Figure 28:
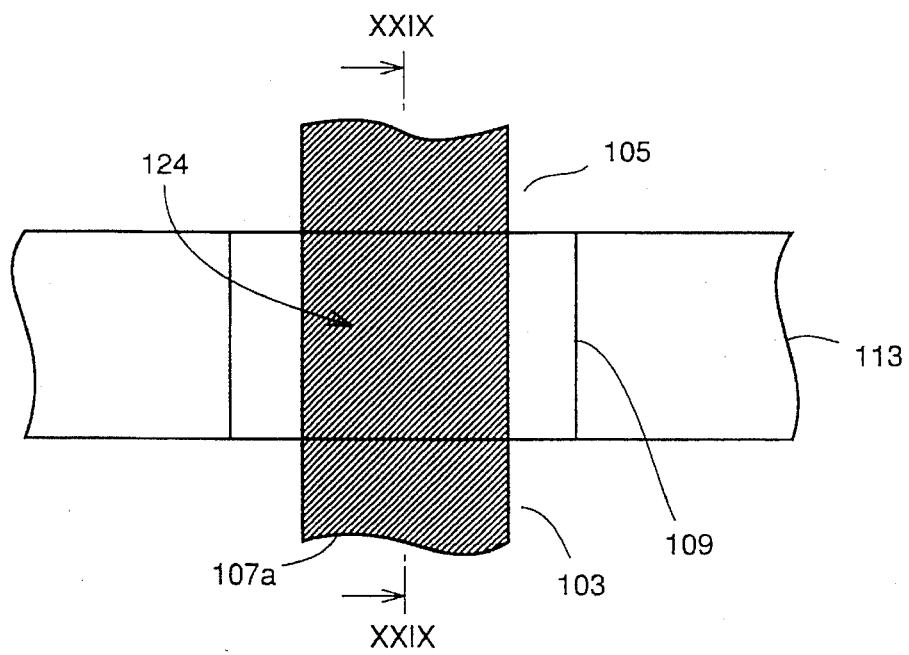
FIG. 28 is a sectional plan view of the memory transistor utilizing the nitrided oxide film or the re-oxidized nitrided oxide film as the tunnel insulating film.
Figure 29:
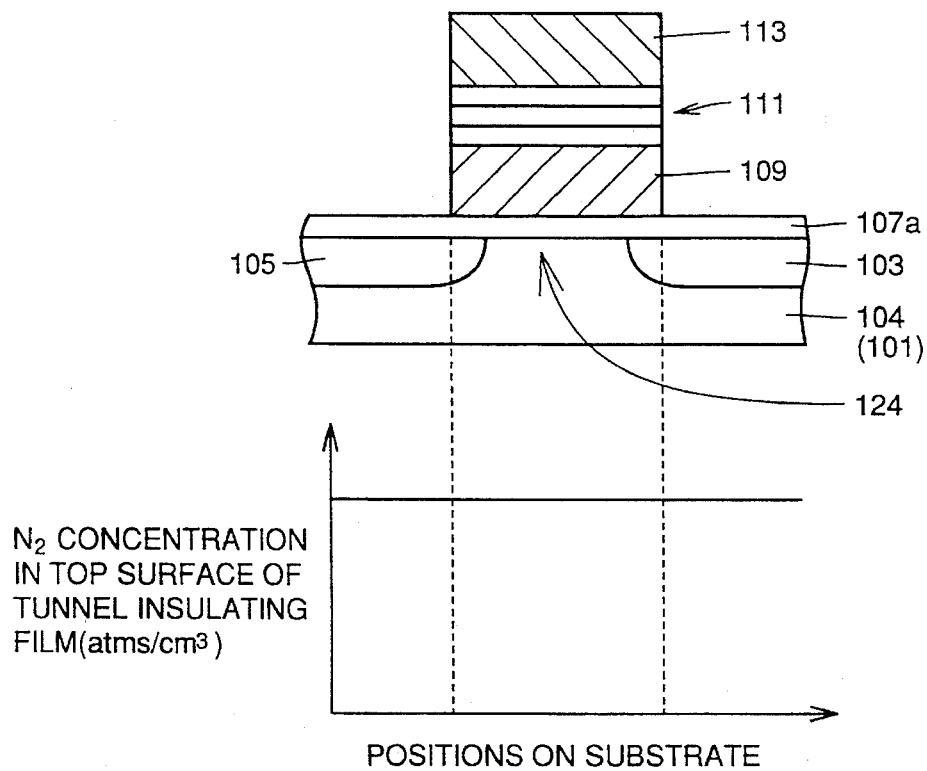
FIG. 29 includes a sectional view taken along line XXIX—XXIX of FIG. 28 and a graph showing the distribution of concentration of nitrogen included in the tunnel insulating film.

Experiments were carried out based upon the assumption of the inventors, resulting in a graph shown in FIG. 9. FIG. 9 is the graph showing the relationship between the density Qinj (C/cm$^2$) of electric charges passed through the tunnel insulating film and the cumulative failure rate (%). The data shown in FIG. 9 are regarding the endurance of tunnel insulating film while the electrons are moved in the direction of erasing.

As shown in FIG. 9, according to the present invention, the endurance of tunnel insulating film 7 during the erase operation can be improved compared to the conventional case (IIb) when the tunnel insulating film is thermally nitrided or thermally nitrided and thermally oxidized.

Thus, according to the data shown in FIG. 9, the assumption of the inventors of the present invention is verified. Therefore, in the memory transistor of the flash memory according to the present invention, the endurance of tunnel insulating film 7 against repeated write/erase operations can be improved by providing nitrided portion D1 at the interface between tunnel insulating film 7 and floating gate electrode 9 as well as nitrided portion D2 at the interface between tunnel insulating film 7 and silicon substrate 1. As a result, a highly reliable flash memory can be obtained.

Figure 5:
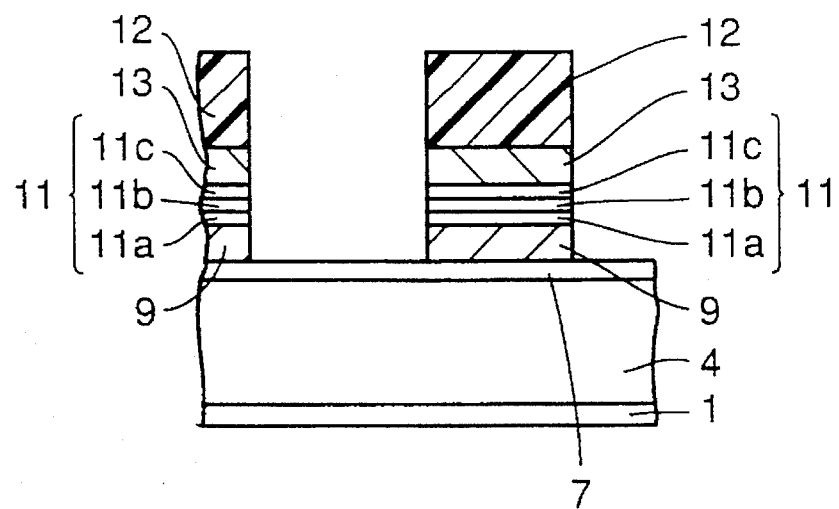
FIGS. 5 and 6 are sectional views showing the fifth and sixth steps of a manufacturing process of the flash memory according to the present invention.
Figure 6:
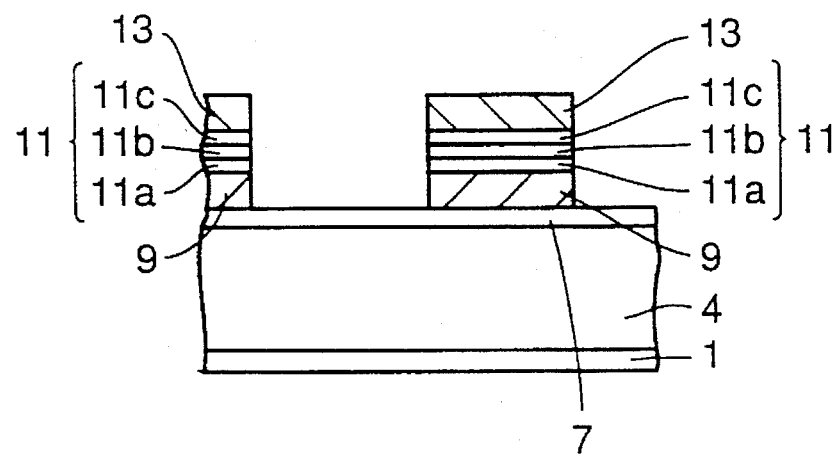
Figure 7:
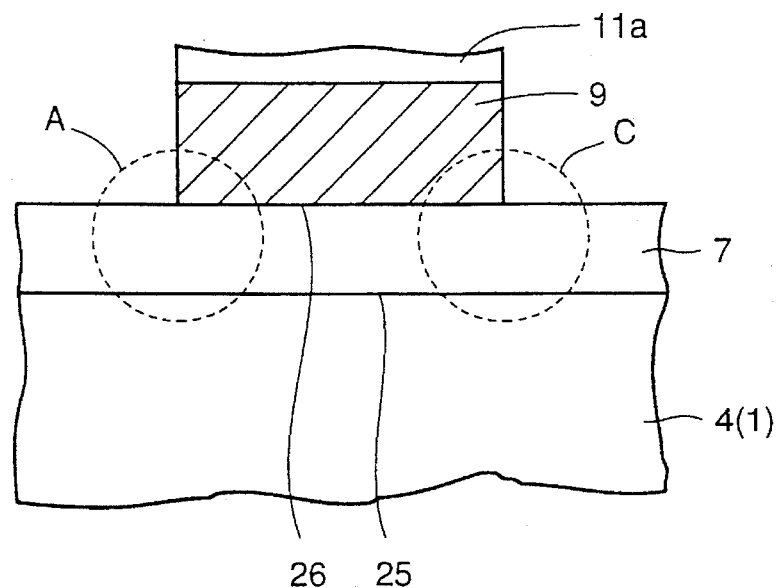
FIG. 7 is an enlarged sectional view in the vicinity of tunnel insulating film 7 shown in FIG. 6.
Figure 8:
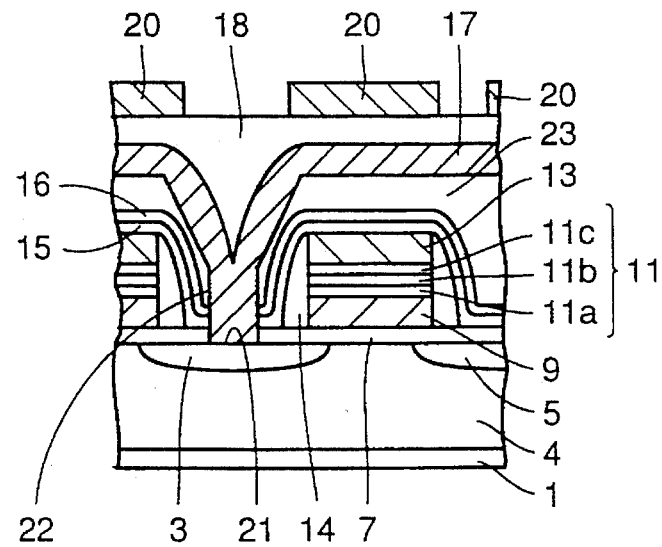
FIG. 8 is a sectional view showing the seventh step of the manufacturing process of the flash memory according to the present invention.

Referring to FIGS. 5–8, a method of manufacturing the flash memory according to the present invention will now be described. FIGS. 5 and 6 are sectional views showing the fifth and sixth steps of a manufacturing process of the non-volatile semiconductor memory device according to the present invention. FIG. 7 is an enlarged sectional view of a portion of the memory transistor shown in FIG. 6. FIG. 8 is a sectional view showing the seventh step of the manufacturing process of the flash memory according to the present invention.

A structure shown in FIG. 5 is obtained after the similar steps as in the conventional example. More particularly, p-type impurity region 4 is formed at a main surface of a p-type silicon substrate 101. Then, tunnel insulating film 7, a material of floating gate electrode 9, silicon oxide film 11a, silicon nitride film 11b, silicon oxide film 11c and a material of control gate electrode 13 are deposited successively on p-type impurity region 4.

After that, a resist pattern 12 patterned in a predetermined shape is formed on the material of control gate electrode 13. Using resist pattern 12 as a mask, control gate 13, insulating layer 11 (11a, 11b, and 11c) and floating gate electrode 9 are formed, successively by etching the above layers.

Referring to FIG. 6, resist pattern 12 is removed. Then, the thermal nitriding and the thermal oxidation are conducted in turn. Thus, by the thermal nitriding of the stacked structure of silicon substrate 1, floating gate electrode 9, tunnel insulating film 7 and control gate electrode 13, nitrided portion 31 shown in FIG. 4 is formed.

Since nitrided portion 31 is formed as shown in FIG. 4, some portions of interfaces 25 and 26 located on the channel region of the memory transistor are scarcely nitrided. This contributes toward maintenance of the driving capability of the memory transistor at lower voltages.

Specific conditions of the thermal nitriding or the thermal oxidation will now be described in detail. In a first method, thermal nitriding is conducted in $NH_3$ atmosphere at a temperature not less than 850° C., and then thermal oxidation is carried out at a temperature not less than 950° C. using $O_2$.

In a second method, after conducting nitriding similarly as above utilizing $NH_3$, oxidation is conducted at a temperature not less than 750° C. utilizing $H_2O$.

In a third method, after nitriding similarly as above utilizing $NH_3$, thermal processing is effected at a temperature not less than 800° C. utilizing $N_2O$.

In a fourth method, thermal processing is effected at a temperature not less than 900° C. utilizing $N_2O$.

By the thermal nitriding and the thermal oxidation as described above, as shown in FIG. 7, interface 26 between floating gate electrode 9 and tunnel insulating film 7 within regions A and C as well as interface 25 between tunnel insulating film 7 and silicon substrate 1 within regions A and C are nitrided.

Accordingly, the nitrided portion of floating gate electrode 9 and the nitrided portion of tunnel insulating film 7 are formed in the vicinity of interface 26 located in regions A and C. Also, the nitrided portion of silicon substrate 1 and the nitrided portion of tunnel insulating film 7 are formed at interface 26 between tunnel insulating film 7 and silicon substrate 1 in regions A and C. This improves the endurance of tunnel insulating film 7 against the write/erase operation.

Referring to FIG. 8, the conventional steps are carried out after the thermal nitriding or the thermal oxidation as described above, so that a sidewall insulating film 14, a silicon oxide film 15, a silicon nitride film 16, a smooth coat film 23, a contact hole 22, a drain contact 21, a bit line 17, a smooth coat film 18, and an aluminum interconnection layer 20 are respectively formed.

The flash memory according to the present invention is thus formed through the above steps. The present invention is applicable to any non-volatile semiconductor memory device having an charge storage electrode and allowing electrical write-erase operation.

As can be seen from the above, according to the present invention, the nitride layer of the electrode for storing charges can be formed at the interface between the electrode for storing charges and the tunnel insulating film located within the tunnel region. Consequently, the endurance of the tunnel insulating film can be improved while electrons are moved from the electrode for storing charges to the semiconductor substrate. As a result, reliability of the non-volatile semiconductor memory device can be improved.

Also, according to the present invention, the memory transistor can be formed such that nitrogen content in the interface between the floating gate and the tunnel insulating film located within the tunnel region is greater than nitrogen content in the interface between the floating gate and the tunnel insulating film located within the tunnel region. This prevents decrease of the current driving capability of the memory transistor at lower voltages and enables improvement of reliability of the non-volatile semiconductor memory device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A non-volatile semiconductor memory device, comprising:

a semiconductor substrate of a first conductivity type having a main surface;

an impurity region of a second conductivity type formed at the main surface of said semiconductor substrate;

a nitrided oxide or re-oxidized nitrided oxide tunnel insulating film formed on said impurity region; and an electrode for storing charges formed on said tunnel insulating film; wherein said electrode for storing charges comprises a nitride portion in contact with said tunnel insulating film in an area within a tunnel region where electrons are moved by tunnel effect to and from said impurity region and said electrode for storing charges.

2. The non-volatile semiconductor memory device according to claim 1, wherein said semiconductor substrate comprises a nitride portion in contact with said tunnel insulating film in an area within a tunnel region.

3. The non-volatile semiconductor memory device according to claim 2, wherein said tunnel insulating film further comprises a nitrided portion in contact with said electrode for storing charges in an area within a tunnel region.

4. The non-volatile semiconductor memory device according to claim 3, wherein said tunnel insulating film further comprises a nitrided portion in contact with said semiconductor substrate in an area within a tunnel region.

5. The non-volatile semiconductor memory device according to claim 1, wherein said electrode for storing charges is formed of polycrystalline silicon and said nitrided portion is a silicon nitrided portion.

6. A non-volatile semiconductor memory device, comprising:

a semiconductor substrate of a first conductivity type having a main surface;

a pair of impurity regions of a second conductivity type formed spaced apart from each other so as to define a channel region at the main surface of said semiconductor substrate;

a tunnel insulating film formed on said channel region and said impurity regions;

a floating gate formed on said tunnel insulating film; and a control gate formed on said floating gate with an insulating layer interposed therebetween; wherein nitrogen content in a portion of an interface between said floating gate and said tunnel insulating film located in a tunnel region where electrons are moved by tunnel effect to and from said impurity regions and said floating gate is greater than nitrogen content in a portion of an interface between said floating gate and said tunnel insulating film located above said channel region.

7. The non-volatile semiconductor memory device according to claim 1, wherein the nitrided portion of said electrode for storing charges is selectively formed only on a side end portion of said electrode for storing charges.

\* \* \* \* \*